United States Patent
Kamp et al.

(10) Patent No.: US 7,098,141 B1
(45) Date of Patent: Aug. 29, 2006

(54) USE OF SILICON CONTAINING GAS FOR CD AND PROFILE FEATURE ENHANCEMENTS OF GATE AND SHALLOW TRENCH STRUCTURES

(75) Inventors: Thomas A. Kamp, San Jose, CA (US); Alan J. Miller, Moraga, CA (US)

(73) Assignee: Lam Research Corporation, Fremont, CA (US)

( * ) Notice: Subject to any disclaimer, the term of this patent is extended or adjusted under 35 U.S.C. 154(b) by 466 days.

(21) Appl. No.: 10/376,227

(22) Filed: Mar. 3, 2003

(51) Int. Cl.
*H01L 21/302* (2006.01)
(52) U.S. Cl. ............... 438/713; 438/719; 438/724; 438/736
(58) Field of Classification Search ........ 438/713, 438/719, 724, 736, 726
See application file for complete search history.

(56) References Cited

U.S. PATENT DOCUMENTS

| | | | |
|---|---|---|---|
| 4,490,209 A | 12/1984 | Hartman | |
| 4,690,729 A | 9/1987 | Douglas | |
| 4,784,720 A | 11/1988 | Douglas | |
| 4,855,015 A | 8/1989 | Douglas | |
| 5,094,712 A | 3/1992 | Becker et al. | |
| 5,352,617 A | 10/1994 | Miwa | |
| 5,674,775 A | 10/1997 | Ho et al. | |
| 5,705,433 A * | 1/1998 | Olson et al. | 438/695 |
| 5,707,486 A | 1/1998 | Collins | |
| 5,728,621 A | 3/1998 | Zheng et al. | |
| 5,753,561 A | 5/1998 | Lee et al. | |
| 5,801,083 A | 9/1998 | Zhong et al. | |
| 5,807,789 A * | 9/1998 | Chen et al. | 438/714 |
| 5,820,261 A | 10/1998 | Yam | |
| 5,874,362 A | 2/1999 | Wong et al. | |
| 5,895,254 A | 4/1999 | Huang et al. | |
| 5,948,283 A | 9/1999 | Grosshart | |
| 6,008,131 A | 12/1999 | Chen | |
| 6,020,270 A | 2/2000 | Wong et al. | |
| 6,033,969 A | 3/2000 | Yoo et al. | |
| 6,037,202 A * | 3/2000 | Witek | 438/212 |
| 6,037,265 A | 3/2000 | Mui et al. | |
| 6,037,266 A | 3/2000 | Tao et al. | |
| 6,083,815 A | 7/2000 | Tsai et al. | |
| 6,090,304 A | 7/2000 | Zhu et al. | |
| 6,171,974 B1 | 1/2001 | Marks et al. | |
| 6,174,786 B1 | 1/2001 | Kelley et al. | |
| 6,218,309 B1 | 4/2001 | Miller et al. | |
| 6,228,727 B1 | 5/2001 | Lim et al. | |
| 6,245,684 B1 | 6/2001 | Zhao et al. | |
| 6,251,792 B1 | 6/2001 | Collins et al. | |
| 6,258,676 B1 | 7/2001 | Lee et al. | |
| 6,283,131 B1 | 9/2001 | Chen et al. | |
| 6,287,974 B1 | 9/2001 | Miller | |
| 6,303,413 B1 | 10/2001 | Kalnitsky et al. | |
| 6,309,926 B1 | 10/2001 | Bell et al. | |
| 6,309,979 B1 | 10/2001 | Patrick et al. | |
| 6,313,007 B1 | 11/2001 | Shive et al. | |

(Continued)

*Primary Examiner*—Nadine Norton
*Assistant Examiner*—Binh X. Tran
(74) *Attorney, Agent, or Firm*—Buchanan Ingersoll & Rooney PC

(57) ABSTRACT

A semiconductor manufacturing process provides a shallow trench in a silicon layer using a silicon containing etch gas to provide controlled top and/or bottom rounding of the trench or to enhance profile control and/or critical dimension control by controlled deposition across a semiconductor substrate. A gate structure can be etched on a semiconductor substrate using a silicon containing gas to enhance profile control and/or critical dimension control.

31 Claims, 5 Drawing Sheets

U.S. PATENT DOCUMENTS

| | | |
|---|---|---|
| 6,358,859 B1 | 3/2002 | Lo et al. |
| 6,391,729 B1 | 5/2002 | Hui |
| 6,444,542 B1 | 9/2002 | Moise et al. |
| 6,479,373 B1 | 11/2002 | Dreybrodt et al. |
| 6,514,378 B1 | 2/2003 | Ni et al. |
| 6,518,195 B1 * | 2/2003 | Collins et al. ............... 438/723 |
| 6,784,077 B1 * | 8/2004 | Lin et al. .................... 438/426 |
| 2002/0155714 A1 * | 10/2002 | Suzuki ....................... 438/689 |
| 2003/0082900 A1 * | 5/2003 | Peng et al. .................. 438/618 |

\* cited by examiner

USE OF SILICON CONTAINING GAS FOR CD AND PROFILE FEATURE ENHANCEMENTS OF GATE AND SHALLOW TRENCH STRUCTURES

FIELD OF THE INVENTION

The present invention relates to an improved method for plasma etching shallow trenches and/or gate structures in the fabrication of semiconductor devices.

BACKGROUND OF THE INVENTION

During the manufacture of semiconductor-based products such as integrated circuits, etching and/or deposition steps may be used to build up or remove layers of material on a semiconductor substrate. A conventional etching procedure involves the use of one or more etch gases energized into a plasma state to effect plasma etching of a layer of material. Such plasma etching has been used to provide shallow trench isolation of individual transistors in an integrated circuit. After etching the trench, the trench is filled in with a dielectric material. Commonly assigned U.S. Pat. Nos. 6,218,309 and 6,287,974 disclose a shallow trench plasma etching process.

In manufacture of transistors, it is conventional to etch the pattern of a photoresist layer into an underlying hard mask layer, strip the photoresist layer, and etch the pattern of the hard mask into a polysilicon layer down to a gate oxide layer. See, for example, U.S. Pat. No. 6,283,131.

SUMMARY OF THE INVENTION

A method of etching a shallow trench in a silicon layer includes supporting a single semiconductor substrate on a substrate support in a plasma etch chamber and plasma etching a shallow trench having a depth of less than 1 µm and a width of less than 0.5 µm in a silicon layer on the semiconductor substrate using an etch gas which includes a silicon containing gas. The silicon-containing gas can be used to enhance profile control and/or critical dimension control by controlled silicon deposition across the semiconductor substrate and/or provide top and/or bottom rounding.

According to one embodiment, the silicon containing gas is supplied to the chamber at a first flow rate during etching of an upper region of the silicon trench layer, the silicon containing gas is supplied to the chamber at a second flow rate during etching of a middle region of the silicon trench layer, and the silicon containing gas is supplied to the chamber at a third flow rate during etching of a lower region of the silicon trench layer, the first and third flow rates being greater than the second flow rate. The first flow rate is preferably effective to provide top rounding of the trench and/or the third flow rate is preferably effective to provide bottom rounding of the trench. Preferably the upper region comprises less than 30% of the trench depth and/or the bottom region comprises less than 30% of the trench depth and/or sidewalls of the trench are slopped at an angle of 70 to 89°. In an embodiment, the first flow rate is effective to taper sidewalls of the upper region of the trench at an angle of less than 80°, the second flow rate is effective to taper the sidewalls of the middle region of the trench at an angle of greater than 80°, and the third flow rate is effective to taper sidewalls of the lower portion of the trench at an angle of less than 80°. For example, the first flow rate can be effective to taper sidewalls of the upper region of the trench at an angle of 72 to 82°, the second flow rate can be effective to taper the sidewalls of the middle region of the trench at an angle of 82 to 88°, and the third flow rate can be effective to taper sidewalls of the lower portion of the trench at an angle of 72 to 82°.

The silicon containing gas can include $SiCl_4$, $SiBr_4$, $CH_3SiH_3$, $HSiCl_3$, $Si_2H_6$, $SiF_4$, $SiH_2Cl_2$, $HSiCl_3$, $SiH_4$ or mixture thereof. The etch gas further can also include a halogen-containing gas selected from $Cl_2$, HBr, $C_xF_y$, $C_xF_yH_z$, $SF_6$, HCl or mixtures thereof. In a preferred embodiment, the $Cl_2$ is supplied to the chamber at a flow rate of 5 to 500 sccm and the silicon containing etch gas comprises $SiCl_4$ supplied to the chamber at a flow rate of 1 to 100 sccm. In another embodiment, the etch gas comprises $Cl_2$, $O_2$, HBr, He, $CF_4$, HCl, Ar, $N_2$, $SF_6$ or mixture thereof. Preferably, the etch gas is energized into a plasma state by inductively coupling radio frequency energy into the plasma chamber and/or the chamber is at a pressure of less than 100 mTorr.

The silicon layer can be a portion of a single crystal silicon wafer beneath a mask such as a silicon nitride mask layer. Alternatively, the silicon layer can be an epitaxial layer, a strained silicon layer or a silicon-germanium layer on a substrate such as a single crystal silicon wafer.

A method of etching a gate structure on a semiconductor substrate includes supporting a semiconductor substrate on a substrate support in a plasma etch chamber and plasma etching a gate structure in a silicon layer on the semiconductor substrate using an etch gas which includes a silicon containing gas.

In the gate etch, the etch gas can include HBr, $O_2$, $Cl_2$, He, $CF_4$, $N_2$, $NF_3$, Ar or mixture thereof and/or the silicon containing gas can include $SiCl_4$, $SiBr_4$, $CH_3SiH_3$, $HSiCl_3$, $Si_2H_6$, $SiF_4$, $SiH_2Cl_2$, $HSiCl_3$, $SiH_4$ or mixture thereof. The gate stack preferably comprises a layer of polycrystalline silicon (polysilicon) on a silicon wafer wherein the polycrystalline silicon layer is between an underlying gate oxide and an overlying hard or soft mask layer such as a silicon nitride mask layer or photoresist. In an embodiment, an upper portion of the polysilicon layer is etched without the silicon containing gas and a lower portion of the polysilicon layer is etched while supplying the silicon containing gas at a flow rate of 1 to 100 sccm. Preferably, the etch gas is energized into a plasma state by inductively coupling radio frequency energy into the plasma chamber and/or the chamber is at a pressure of less than 100 mTorr. During the gate etch, the silicon-containing gas can be used to enhance profile control and/or critical dimension control by controlled silicon deposition across the semiconductor substrate. In a preferred process, the gate structure is etched in three steps, the etch gas including $Cl_2$, HBr, $O_2$ and $CF_4$ during the first step, the etch gas including HBr and $O_2$ during the second step and the etch gas including HBr, $O_2$ and He during the third step, the HBr being supplied to the chamber at a higher flow rate during the second step than during the third step.

BRIEF DESCRIPTION OF THE DRAWING FIGURES

FIG. 2 is a schematic illustration of a shallow trench etching process wherein the photoresist and BARC layers have been removed and the silicon nitride and pad oxide layers have been etched through.

DETAILED DESCRIPTION OF PREFERRED EMBODIMENTS

Figure 1:
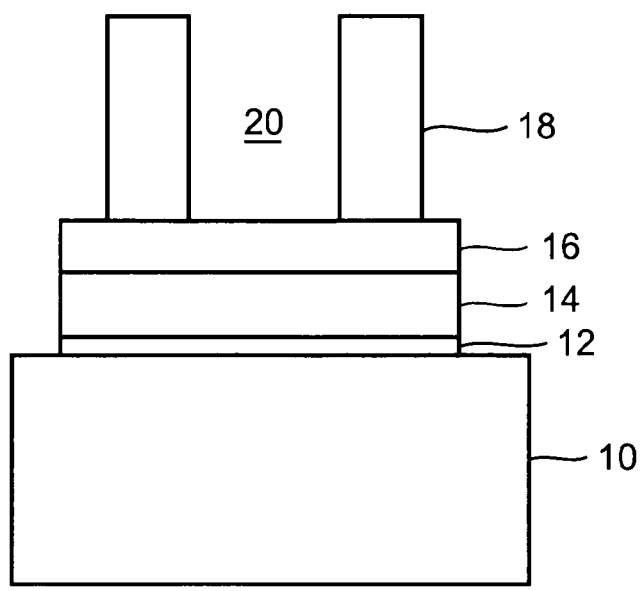
FIG. 1 is a schematic illustration of a stack of layers on a silicon substrate prior to forming a shallow trench isolation feature.

Many plasma etch applications rely on the generation of a passivation layer to obtain the desired feature profile. The primary mechanism for profile control involves the balance of etch and deposition reactions. The etch reactions are generally directly controlled by the reaction chamber parameters such as input power, pressure, and gas flows. In plasma etching of silicon wafers, etch reaction products are the primary deposition source with the result that deposition mechanisms are indirectly controlled.

For shallow trench and gate applications, various etch gas chemistries are used. For example, when using $HBr-O_2$ etch gas chemistries, the passivation layer is primarily made up of $Si_xBr_yO_z$. For $Cl_2-O_2$ etch gas chemistries, the passivation layer is primarily made of $Si_xCl_yO_z$. Other constituents of the passivation layer can include N, C, H and F. Moreover, as a result of etching of silicon wafers and/or chamber materials such as quartz components, volatile silicon etch byproducts are incorporated in the passivation layer.

As explained above, silicon can be incorporated in passivation layers due to etching of silicon sources such as silicon wafers and/or chamber materials. Such silicon sources are secondary products that are not directly controlled by the etch gas chemistry. Moreover, as the volatile silicon etch byproducts are transported from the wafer surface toward the vacuum evacuation port, there is a finite possibility of deposition of the silicon-containing byproducts on the wafer surface. This can lead to non-uniform silicon byproduct concentration across the wafer and lead to non-uniformity of the etched feature profile and critical dimension.

Many shallow trench applications require top and/or bottom rounding. U.S. Pat. No. 5,807,789 describes a shallow trench with tapered profile and rounded corners. The primary mechanism for rounding is by creating redeposition byproducts. The use of polymer spacers for top rounding of shallow trench isolation regions is described in U.S. Pat. No. 5,801,083. Commonly assigned U.S. Pat. Nos. 6,218,309 and 6,287,974 describe top rounding of shallow trench isolation features. According to one embodiment, a method of etching a shallow trench in a silicon layer includes supporting a single semiconductor substrate on a substrate support in a plasma etch chamber and plasma etching a shallow trench having a depth of less than 1 μm and a width of less than 0.5 μm in a silicon layer on the semiconductor substrate using an etch gas which includes a silicon containing gas.

The plasma can be produced in various types of plasma reactors. Such plasma reactors typically have energy sources which use RF energy, microwave energy, magnetic fields, etc. to produce a medium to high density plasma. For instance, a high density plasma could be produced in a transformer coupled plasma (TCP™) available from Lam Research Corporation which is also called inductively coupled plasma reactor, an electron-cyclotron resonance (ECR) plasma reactor, a helicon plasma reactor, or the like. An example of a high flow plasma reactor which can provide a high density plasma is disclosed in commonly owned U.S. Pat. No. 5,820,261, the disclosure of which is hereby incorporated by reference. The plasma can also be produced in a parallel plate etch reactor such as the dual frequency plasma etch reactor described in commonly owned U.S. Pat. No. 6,090,304, the disclosure of which is hereby incorporated by reference.

The process can be carried out in an inductively coupled plasma reactor maintained at a desired vacuum pressure by a vacuum pump connected to an outlet in a wall of the reactor. Etching gas can be supplied to a showerhead or injector arrangement be supplying gas from a gas supply to a plenum extending around the underside of a dielectric window. A high density plasma can be generated in the reactor by supplying RF energy from an RF source to an external RF antenna such as a planar spiral coil having one or more turns outside the dielectric window on top of the reactor. The plasma generating source can be part of a modular mounting arrangement removably mounted in a vacuum tight manner on the upper end of the reactor.

A wafer can be supported within the reactor on a substrate support such as a cantilever chuck arrangement removably supported by a modular mounting arrangement from a sidewall of the reactor. Such a substrate support is at one end of a support arm mounted in a cantilever fashion such that the entire substrate support/support arm assembly can be removed from the reactor by passing the assembly through an opening in the sidewall of the reactor. The substrate support can include a chucking apparatus such as an electrostatic chuck and the substrate can be surrounded by a dielectric focus ring. The chuck can include an RF biasing electrode for applying an RF bias to the substrate during an etching process. The etching gas supplied by a gas supply can flow through channels between the window and an underlying gas distribution plate (GDP) and enter the interior of the chamber through gas outlets in the GDP. The reactor can also include a heated liner extending from the GDP.

The process can also be carried out in a parallel plate plasma reactor which includes an interior maintained at a desired vacuum pressure by a vacuum pump connected to an outlet in a wall of the reactor. Etching gas can be supplied to a showerhead electrode by supplying gas from a gas supply and a medium density plasma can be generated in the reactor by supplying RF energy from one or more RF sources to the showerhead electrode and/or a bottom electrode or the showerhead electrode can be electrically grounded and RF energy at two different frequencies can be supplied to the bottom electrode.

It will be apparent to those skilled in the art that the flow rates of the various gases will depend on factors such as the type of plasma reactor, the power settings, the vacuum pressure in the reactor, the dissociation rate for the plasma source, etc.

The reactor pressure is preferably maintained at a level suitable for sustaining a plasma in the reactor. In general, too low a reactor pressure can lead to plasma extinguishment whereas in a high density etch reactor too high a reactor pressure can lead to the etch stop problem. For high density plasma reactors, the reactor is preferably at a pressure below 100 mTorr. For medium density plasma reactors, the reactor is preferably at a pressure from 30 to 100 mTorr, more preferably from 50 to 100 mTorr. Due to plasma confinement at the semiconductor substrate undergoing etching, the vacuum pressure at the substrate surface may be higher than the vacuum pressure setting for the reactor.

The substrate support supporting the semiconductor substrate undergoing etching preferably cools the substrate enough to prevent deleterious side reactions such as burning of any photoresist on the substrate and formation of undesirable reactant gas radicals. In high and medium density plasma reactors, it is sufficient to cool the substrate support to a temperature of −10 to +80° C. The substrate support can include a bottom electrode for supplying an RF bias to the substrate during processing thereof and an ESC for clamping the substrate. For example, the substrate can comprise a silicon wafer which is electrostatically clamped and cooled by supplying helium (He) at a desired pressure between the wafer and top surface of the ESC. In order to maintain the wafer at a desired temperature of the He can be maintained at a pressure of 10 to 30 Torr in the space between the wafer and the chuck.

Figure 2:
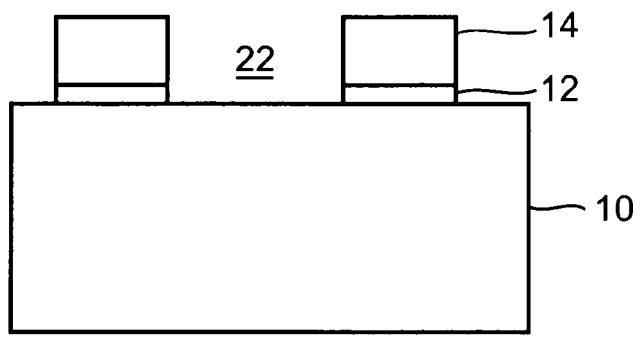
Figure 3:
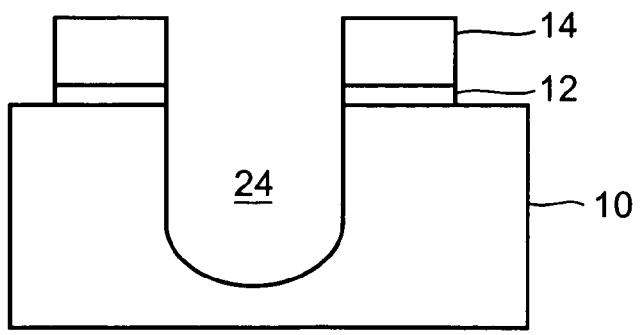
FIG. 3 is a schematic illustration of a shallow trench isolation feature etched into a silicon substrate.

FIGS. 1–3 show schematic representations of how a shallow trench can be etched into a silicon layer. As shown in FIG. 1, a silicon substrate 10 includes a stack of layers thereon including a 100 Å pad oxide 12, a 1500 Å thick layer of silicon nitride 14, a 600 Å thick bottom antireflective coating (BARC) 16, and a 3200 Å thick layer of photoresist 18 which has been previously patterned to provide an opening 20. In etching shallow trenches on a silicon wafer, the photoresist 18 will include many openings 20 corresponding to the desired trench locations. The silicon nitride layer 14 is opened at the locations of the openings 20 to form a patterned hard mask.

In opening the hard mask 14, the BARC layer 16 is opened with a plasma etch. In an exemplary BARC open step, the chamber can be at a vacuum pressure of 5 mTorr and the antenna used to inductively couple radio frequency energy into the chamber can be set at 350 watts. The substrate support can include an electrode which provides an RF bias by powering the electrode with 88 watts. The BARC can be opened using a plasma etch with 50 sccm $CF_4$ for 60 seconds while maintaining the temperature of the wafer at about 60° C. Next, the silicon nitride layer 14 and pad oxide 12 are opened to form openings 22 with the chamber set at the same pressure but raising the antenna power to 1000 watts. The silicon nitride layer can be etched with 70 sccm $CHF_3$ and 300 sccm Ar for 44 seconds while maintaining the wafer temperature at about 60° C. After that, the photoresist and BARC are stripped using a chamber pressure of 10 mTorr and 1000 watts to the antenna. The photoresist can be stripped using 200 sccm $O_2$ for 45 seconds.

As a result of the strip step, the BARC and photoresist layers have been removed and areas of exposed silicon have become oxidized from the $O_2$ plasma. In an exemplary process, the chamber is set at 5 mTorr and 350 watts power is supplied to the antenna. The oxidized silicon is etched using 50 sccm $CF_4$ for 7 seconds while maintaining the wafer temperature at about 60° C. Next, the silicon substrate can be etched with the chamber pressure set at 50 mTorr and 1000 watts power being supplied to the antenna. The bottom electrode can be supplied about 220 watts power and the etch gas can include 125 sccm $Cl_2$, 14 sccm $O_2$ and 14 sccm $N_2$ while maintaining the wafer temperature at about 60° C.

In order to provide desired rounding and/or profile and/or CD control, a silicon containing gas such as $SiCl_4$ can also be added to the etch gas. After forming the trench structure 24 as shown in FIG. 3, the wafer can be cleaned using a 2 minute HF dip followed by a deionized water spin rinse.

Figure 4:
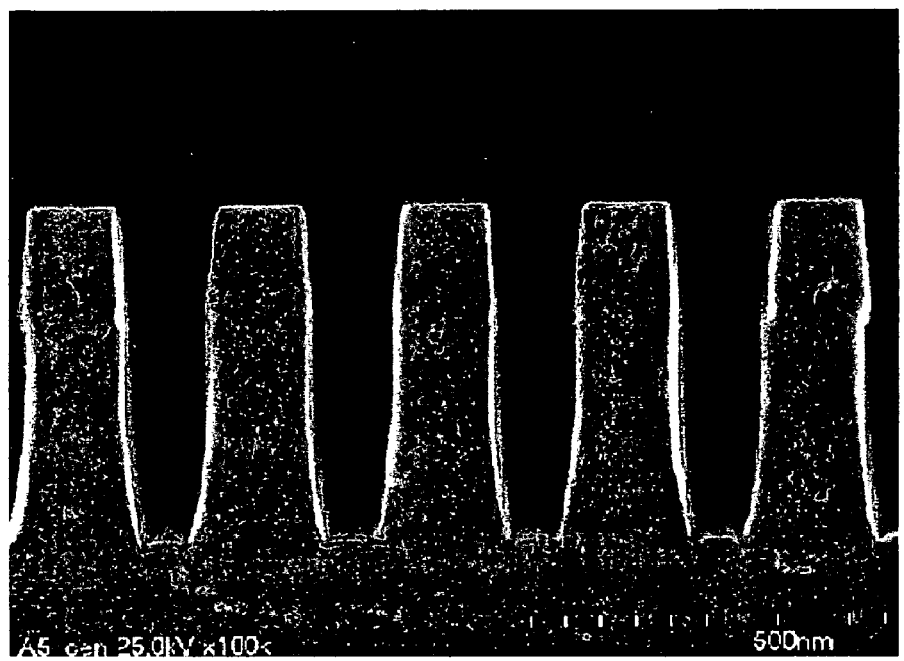
FIG. 4 is a photomicrograph of shallow trench isolation features having a bowed profile and subtrenched bottom.
Figure 5:
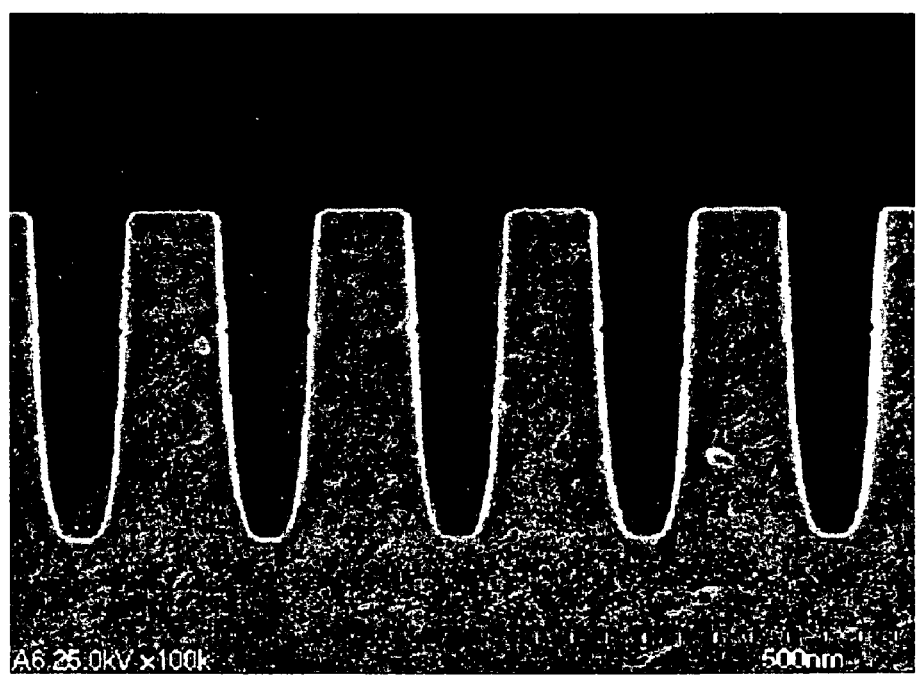
FIG. 5 is a photomicrograph of shallow trench isolation features etched with a silicon-containing gas.
Figure 6:
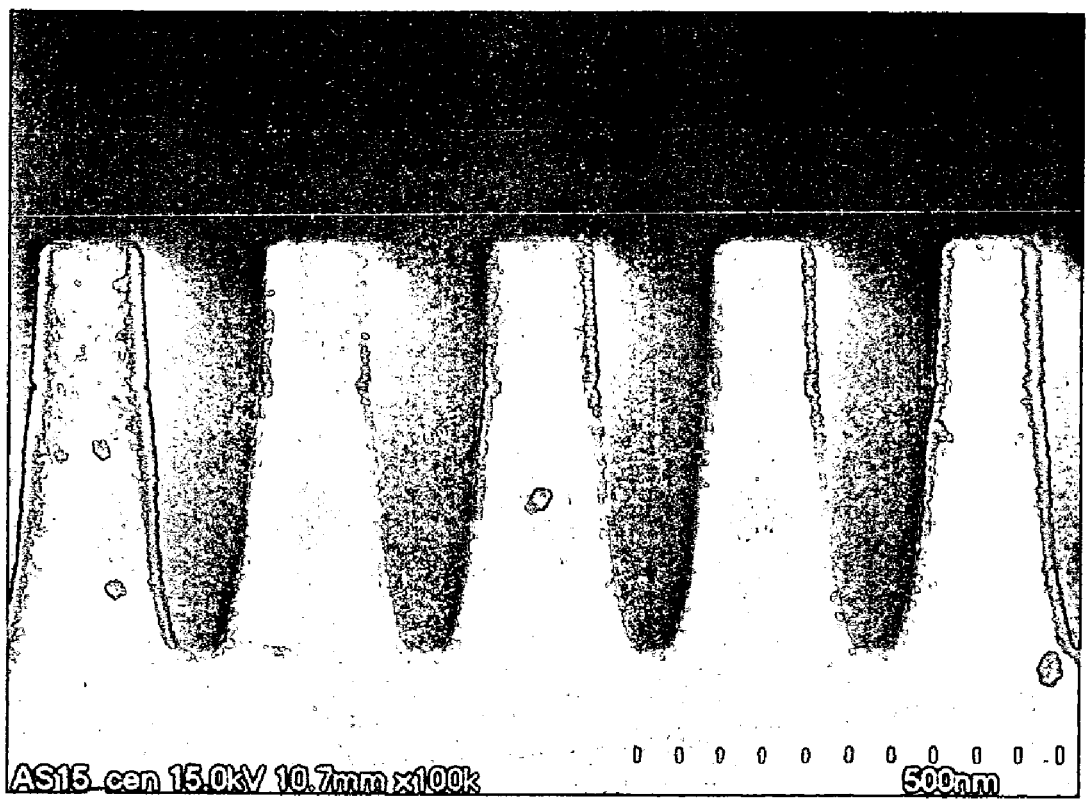
FIG. 6 is a photomicrograph of shallow trench isolation features which include top and bottom rounding.

FIG. 4 is a photomicrograph of a trench structure formed using 125 sccm $Cl_2$ and no $SiCl_4$ addition to the etch gas. As shown in FIG. 4, the trenches have a bowed profile and subtrenched bottoms. Improved critical dimension (CD) and profile control can be obtained by adding a silicon-containing gas to the etch gas. FIG. 5 is a photomicrograph of a trench structure formed when a silicon-containing gas is used during the shallow trench etch. The trench structure shown in FIG. 5 was etched with 75 sccm $Cl_2$ and 25 sccm $SiCl_4$. FIG. 6 is a photomicrograph of tapered trenches having rounded tops and bottoms as a result of using a silicon-containing gas during the shallow trench etch.

Figure 7:
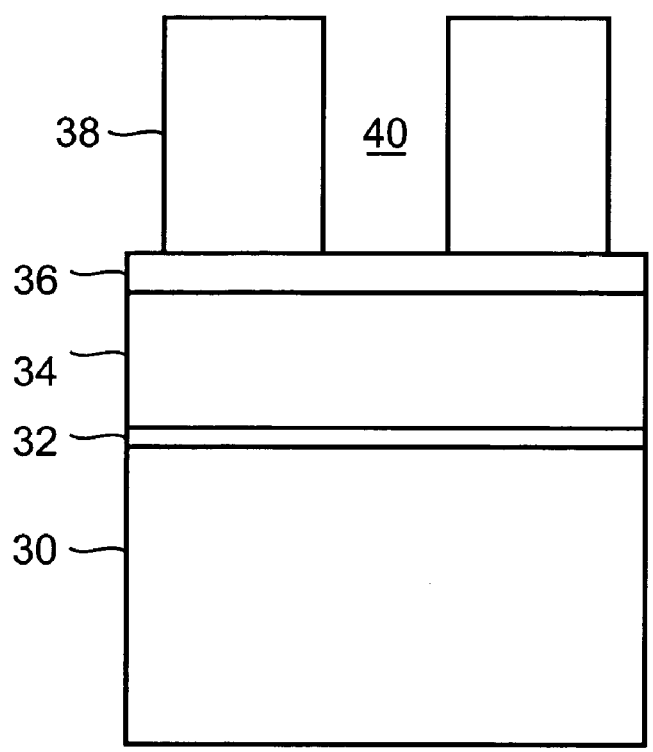
FIG. 7 is a schematic of a silicon substrate having a stack of layers thereon prior to carrying out a gate etch.
Figure 8:
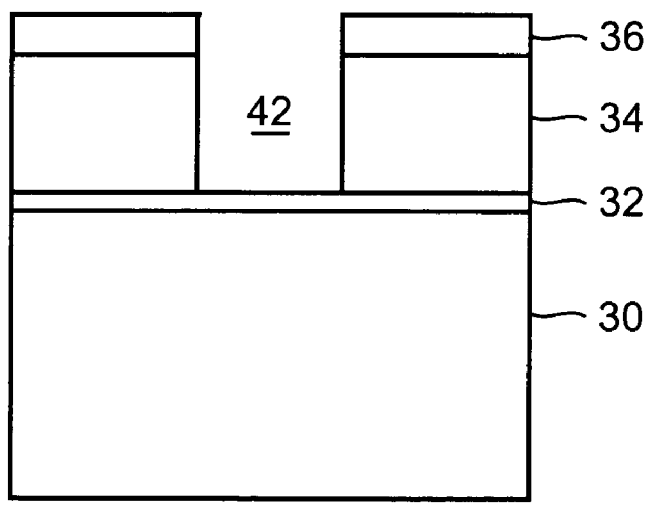
FIG. 8 is a schematic illustration of a silicon substrate having silicon nitride and polysilicon layers thereon etched through to a gate oxide.

FIGS. 7 and 8 are schematics representative of a gate etch. As shown in FIG. 7, a silicon wafer 30 includes a stack of layers thereon which includes a 15 Å thick layer of oxide 32, a 1500 Å thick layer of polysilicon 34, a 200 Å thick layer of silicon nitride 36, and a 2000 Å thick layer of photoresist 38 which has been patterned to include openings 40 therein corresponding to the locations of the gate etch. While a single opening 40 is shown in FIG. 7, in etching gate structures on a wafer there will be many openings 40 corresponding to the desired locations of the gates.

Figure 9:
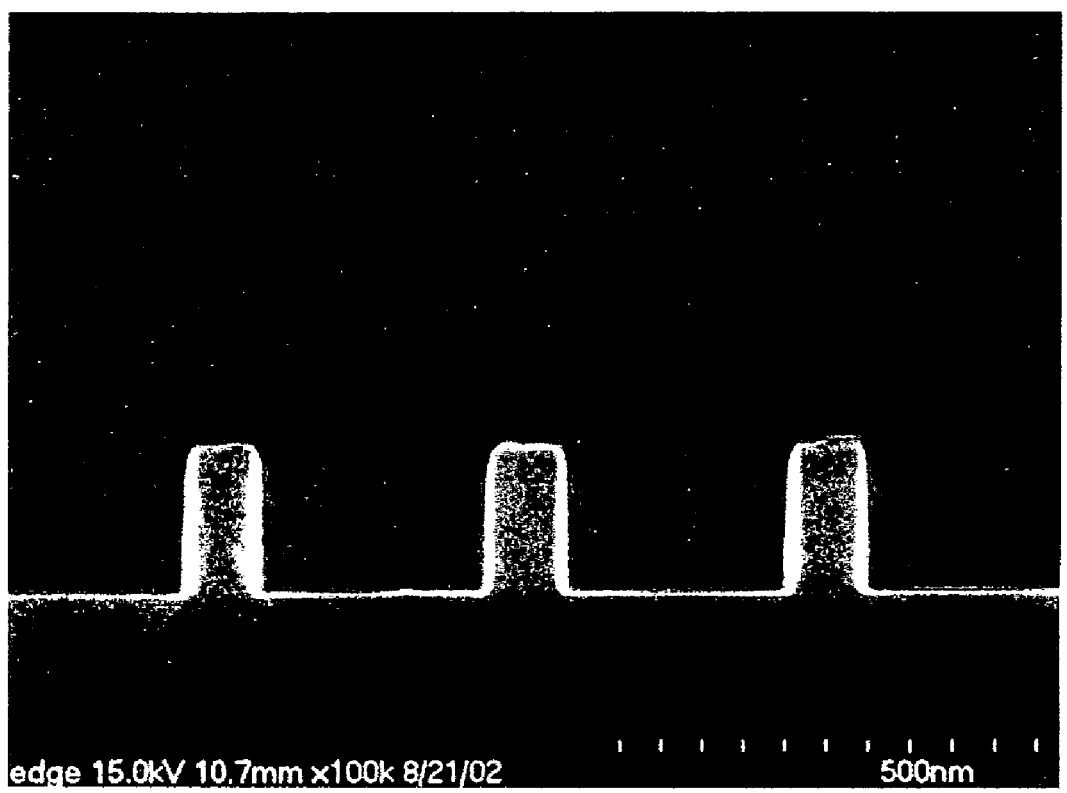
FIG. 9 is a photomicrograph of an etched gate feature with CD control.

An exemplary process of a gate etch is as follows. Initially, a trimming step is carried out with the chamber pressure set at 15 mTorr and the antenna power set at 400 watts. The etch gas for the trimming step can include 30 sccm HBr and 10 sccm $O_2$. Then, the silicon nitride layer 36 is etched with the chamber set at 10 mTorr and the antenna set at 800 watts power. The etch gas can include 100 sccm $CF_4$ to provide an opening in the silicon nitride layer 36 corresponding to the opening 40. Then, the polysilicon is etched in three steps which include a first main etch, a second main etch and an over etch. In the first main etch, the chamber is set at 10 mTorr and the antenna is set at 800 watts power. The etch gas includes 50 sccm $Cl_2$, 175 sccm HBr, 60 sccm $Cf_4$ and 5 sccm $O_2$. In the second main etch, the chamber is set at 30 mTorr and the antenna is set at 350 watts. The etch gas for the second main etch includes 300 sccm HBr and 3 sccm $O_2$. In the over etch, the chamber is set at 80 mTorr and the antenna is supplied 500 watts power. The etch gas in the over etch includes 130 sccm HBr, 4 sccm $O_2$ and about 270 sccm He. A silicon containing gas such as $SiCl_4$ can be added to the first or second main etch and/or the over etch to improve gate profile control and within wafer CD control. After the polysilicon etch, an opening 42 extends to the gate oxide 32, as shown in FIG. 8. FIG. 9 is a photomicrograph of an etched gate feature with CD control obtained by adding a silicon containing gas to the etch gas.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of etching a shallow trench in a silicon layer comprising:
supporting a single semiconductor substrate on a substrate support in a plasma etch chamber;

plasma etching a shallow trench having a depth of less than 1 μm and a width of less than 0.5 μm in a silicon layer on the semiconductor substrate using an etch gas which includes a silicon containing gas wherein the silicon containing gas is supplied to the chamber at a first flow rate during etching of an upper region of the silicon trench layer, the silicon containing gas being supplied to the chamber at a second flow rate during etching of a middle region of the silicon trench layer, and the silicon containing gas being supplied to the chamber at a third flow rate during etching of a lower region of the silicon trench layer, the first and third flow rates being greater than the second flow rate.

2. The method of claim 1, wherein the first flow rate is effective to provide top rounding of the trench.

3. The method of claim 1, wherein the third flow rate is effective to provide bottom rounding of the trench.

4. The method of claim 1, wherein the silicon containing gas comprises $SiCl_4$, $SiBr_4$, $CH_3SiH_3$, $HSiCl_3$, $Si_2H_6$, $SiF_4$, $SiH_2Cl_2$, $SiH_4$ or mixture thereof.

5. The method of claim 1, wherein the silicon layer comprises an exposed region of a single crystal silicon wafer, an exposed region of a strained silicon layer or a silicon germanium layer.

6. The method of claim 1, wherein the upper region comprises less than 30% of the trench depth and/or the bottom region comprises less than 30% of the trench depth.

7. The method of claim 1, wherein the silicon layer is beneath a silicon nitride mask layer.

8. The method of claim 1, wherein sidewalls of the trench are sloped at an angle of 70 to 89°.

9. The method of claim 1, wherein the first flow rate is effective to taper sidewalls of the upper region of the trench at an angle of less than 80°, the second flow rate is effective to taper the sidewalls of the middle region of the trench at an angle of greater than 80°, and the third flow rate is effective to taper sidewalls of the lower portion of the trench at an angle of less than 80°.

10. The method of claim 1, wherein the first flow rate is effective to taper sidewalls of the upper region of the trench at an angle of about 72 to 82°, the second flow rate is effective to taper the sidewalls of the middle region of the trench at an angle of about 82 to 88°, and the third flow rate is effective to taper sidewalls of the lower portion of the trench at an angle of about 72 to 82°.

11. The method of claim 1, wherein the etch gas comprises $Cl_2$, $O_2$, HBr, He, $CF_4$, HCl, Ar, $N_2$, $SF_6$ or mixture thereof.

12. The method of claim 1, wherein the etch gas is energized into a plasma state by inductively coupling radio frequency energy into the plasma chamber.

13. The method of claim 1, wherein the chamber is at a pressure of less than 100 mTorr.

14. The method of claim 1, wherein the silicon-containing gas enhances profile control and/or critical dimension control by controlled silicon-containing deposition across the semiconductor substrate.

15. The method of claim 1, further comprising plasma etching openings in a mask overlying the silicon layer with an etch gas comprising $CHF_3$ and Ar.

16. The method of claim 1, wherein the shallow trench etch includes a break through step using $CF_4$.

17. The method of claim 1, wherein the etch gas further comprises a halogen-containing gas selected from $Cl_2$, HBr, $C_xF_y$, $C_xF_yH_z$, $SF_6$, HCl or mixtures thereof.

18. The method of claim 17, wherein the $Cl_2$ is supplied to the chamber at a flow rate of 5 to 500 sccm and the silicon containing etch gas comprises $SiCl_4$ supplied to the chamber at a flow rate of 1 to 100 sccm.

19. A method of etching a gate structure on a semiconductor substrate, comprising:
supporting a semiconductor substrate on a substrate support in a plasma etch chamber;
plasma etching a gate structure in a silicon layer on the semiconductor substrate using an etch gas which includes a silicon containing gas wherein the gate structure is etched in first and second main etch steps and an overetch step, the etch gas including $Cl_2$, HBr, $O_2$ and $CF_4$ during the first main etch step, the etch gas including HBr and $O_2$ during the second main etch step and the etch gas including HBr, $O_2$ and He during the overetch step, the HBr being supplied to the chamber at a higher flow rate during the second main etch step than during the overetch step, the etch gas including the silicon-containing gas during the first main etch step, the second main etch step and/or during the overetch step.

20. The method of claim 19, wherein the silicon containing gas comprises $SiCl_4$, $SiBr_4$, $CH_3SiH_3$, $HSiCl_3$, $Si_2H_6$, $SiF_4$, $SiH_2Cl_2$, $SiH_4$ or mixture thereof.

21. The method of claim 19, wherein the silicon layer comprises a layer of polycrystalline silicon on a silicon wafer.

22. The method of claim 19, wherein the silicon layer is between an underlying gate oxide and an overlying hard or soft mask layer.

23. The method of claim 19, wherein the silicon layer is beneath a silicon nitride mask layer or photoresist.

24. The method of claim 19, wherein the etch gas is energized into a plasma state by inductively coupling radio frequency energy into the plasma chamber.

25. The method of claim 19, wherein the chamber is at a pressure of less than 100 mTorr.

26. The method of claim 19, wherein the silicon-containing gas enhances profile control and/or critical dimension control by controlled silicon deposition across the semiconductor substrate.

27. The method of claim 19, further comprising plasma etching openings in a mask overlying the silicon layer with an etch gas comprising $CHF_3$ and Ar.

28. A method of etching a gate structure on a semiconductor substrate, comprising:
supporting a semiconductor substrate on a substrate support in a plasma etch chamber;
plasma etching a gate structure in a silicon layer on the semiconductor substrate using an etch gas which includes a silicon containing gas wherein an upper portion of the silicon layer is etched without the silicon containing gas and a lower portion of the silicon layer is etched while supplying the silicon containing gas at a flow rate of 1 to 100 sccm.

29. The method of claim 28, wherein the etch gas comprises HBr, $O_2$, $Cl_2$, He, $CF_4$, $N_2$, $NF_3$, Ar or mixture thereof.

30. The method of claim 28, wherein the etch gas comprises $O_2$ and HBr.

31. The method of claim 28, wherein the gate structure is etched in a multistep process wherein the etch gas includes HBr and the silicon-containing gas during at least one step of the multistep process.

* * * * *